(12) United States Patent
Lam

(10) Patent No.: US 7,821,122 B2
(45) Date of Patent: Oct. 26, 2010

(54) METHOD AND SYSTEM FOR INCREASING CIRCUITRY INTERCONNECTION AND COMPONENT CAPACITY IN A MULTI-COMPONENT PACKAGE

(75) Inventor: Ken Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 178 days.

(21) Appl. No.: 11/315,409

(22) Filed: Dec. 22, 2005

(65) Prior Publication Data
US 2007/0145562 A1 Jun. 28, 2007

(51) Int. Cl.
H01L 23/12 (2006.01)
H01L 21/00 (2006.01)
H05K 1/18 (2006.01)

(52) U.S. Cl. .................. 257/700; 257/724; 257/777; 257/782; 257/E21.614; 361/748; 361/784; 361/792; 438/109; 438/125

(58) Field of Classification Search .............. None
See application file for complete search history.

(56) References Cited

U.S. PATENT DOCUMENTS

| | | | |
|---|---|---|---|
| 5,220,489 A | 6/1993 | Barreto et al. | |
| 5,570,273 A | 10/1996 | Siegel et al. | |
| 6,153,290 A * | 11/2000 | Sunahara | 428/210 |
| 6,229,218 B1 | 5/2001 | Casey et al. | |
| 6,323,096 B1 | 11/2001 | Saia et al. | |
| 6,403,881 B1 | 6/2002 | Hughes | |
| 6,424,034 B1 | 7/2002 | Ahn et al. | |
| 6,618,267 B1 | 9/2003 | Dalal et al. | |
| 6,653,725 B2 | 11/2003 | Ahn et al. | |
| 6,674,173 B1 | 1/2004 | Wang | |
| 6,734,539 B2 | 5/2004 | Degani et al. | |
| 6,774,492 B2 | 8/2004 | Ahn et al. | |
| 6,853,944 B2 | 2/2005 | Fan | |
| 6,946,922 B2 | 9/2005 | Takemura et al. | |
| 7,023,288 B2 | 4/2006 | Takanashi et al. | |
| 7,132,753 B1 | 11/2006 | St. Amand et al. | |
| 7,176,506 B2 | 2/2007 | Beroz et al. | |

(Continued)

FOREIGN PATENT DOCUMENTS

EP 1439581 A2 7/2004

(Continued)

OTHER PUBLICATIONS

International Patent Application No. PCT/US06/49043, International Search Report mailed Mar. 31, 2008, 3 pgs.

(Continued)

*Primary Examiner*—Alonzo Chambliss
(74) *Attorney, Agent, or Firm*—Schwegman, Lundberg & Woessner, P.A.

(57) ABSTRACT

A method and system for fabricating a interconnect substrate for a multi-component package is disclosed. The multi-component package includes at least one die and a package substrate. The method and system include providing an insulating base and providing at least one conductive layer. The at least one conductive layer provides interconnects for at least one discrete component. The interconnect substrate is configured to be mounted on the at least one die and to have the at least one discrete component mounted on the interconnect substrate.

36 Claims, 3 Drawing Sheets

U.S. PATENT DOCUMENTS

| | | |
|---|---|---|
| 7,205,656 B2 * | 4/2007 | Kim et al. .................... 257/723 |
| 7,342,308 B2 | 3/2008 | Lam |
| 2002/0066593 A1 | 6/2002 | Burdon et al. |
| 2002/0127775 A1 | 9/2002 | Haba et al. |
| 2002/0185744 A1 | 12/2002 | Katagiri et al. |
| 2004/0238857 A1 | 12/2004 | Beroz et al. |
| 2005/0135041 A1 | 6/2005 | Kang et al. |
| 2005/0258529 A1 | 11/2005 | Green et al. |
| 2006/0012037 A1 | 1/2006 | Raedt et al. |
| 2006/0113679 A1 | 6/2006 | Takatsu et al. |
| 2006/0245308 A1 | 11/2006 | Macropoulos et al. |
| 2007/0070608 A1 | 3/2007 | Warren et al. |
| 2007/0138629 A1 | 6/2007 | Lam |
| 2008/0105985 A1 | 5/2008 | Lam |
| 2008/0280396 A1 * | 11/2008 | Kim et al. .................... 438/109 |

FOREIGN PATENT DOCUMENTS

| | | |
|---|---|---|
| TW | I230426 | 4/2005 |
| TW | I233196 | 5/2005 |
| TW | I239059 | 9/2005 |
| TW | I245407 | 12/2005 |
| WO | WO-2004/003980 A2 | 1/2004 |
| WO | WO-2007/075648 A2 | 7/2007 |
| WO | WO-2007/076020 A2 | 7/2007 |
| WO | WO-2007075648 A3 | 7/2007 |

OTHER PUBLICATIONS

"International Application Serial No. PCT/US2006/48376; International search report on written opinion mailed on Sep. 25, 2008", 12 Pgs.

"Taiwan Application Serial No. 095147577, Office Action mailed Sep. 29, 2009", 5 pgs.

"U.S. Appl. No. 12/015,122, Response filed May 26, 2010 to Non Final Office Action mailed Feb. 26, 2010", 10 pgs.

"U.S. Appl. No. 12/015,122, Non-Final Office Action mailed Feb. 26, 2010", 14 pgs.

* cited by examiner

US 7,821,122 B2

METHOD AND SYSTEM FOR INCREASING CIRCUITRY INTERCONNECTION AND COMPONENT CAPACITY IN A MULTI-COMPONENT PACKAGE

RELATED APPLICATIONS

The present invention is related to co-pending U.S. patent application, entitled COMPONENT STACKING FOR INTEGRATED CIRCUIT ELECTRONIC PACKAGE, ser. No. (3715P), filed on Dec. 20, 2005, and assigned to the assignee of the present invention.

FIELD OF THE INVENTION

The present invention relates to semiconductor packaging and more particularly to a method and system for increasing circuitry interconnection and component capacity in a multi-component package.

BACKGROUND OF THE INVENTION

Conventional multi-component packages, such as stacked-die packaging, package-in package devices, and package-on-package devices are used in a variety of applications. In conventional multi-component packages, the dice are typically mounted on a conventional package substrate, which includes the interconnections for the dice. In addition to dice, such conventional multi-component packages include various active and passive discrete components. For example, the conventional multi-component package may include resistors, capacitors, inductors, voltage references, and other active discrete components. These active and passive discrete components are mounted on the package substrate, typically using solder or conductive epoxy. The discrete components may also be electrically connected to the interconnection circuitry through pads on the conventional package substrate. Thus, the package substrate includes pads and interconnection circuitry for all of the discrete components in the conventional multi-component package.

Although the conventional multi-component package functions, one of ordinary skill in the art will readily recognize that the conventional multi-component package may be large. Moreover, the pads typically cannot be placed on the die. Consequently, the discrete components are typically placed along side the dice. As a result, the size of the conventional multi-component package typically grows in direct proportion to the size and quantity of discrete components. Stated differently, the size of the conventional multi-component package increases for increased connectivity with discrete components. Thus, the footprint and/or height of the conventional multi-component package significantly increases for a larger and/or more discrete components. Such an increase in size is undesirable for many applications, such as wireless applications.

Accordingly, what is needed is a method and system for improving the connectivity of multi-component packages. The present invention addresses such a need.

BRIEF SUMMARY OF THE INVENTION

The present invention provides a method and system for fabricating an interconnect substrate for a multi-component package. The multi-component package includes at least one die and a package substrate. The method and system include providing an insulating base and providing at least one conductive layer. At least one conductive layer provides interconnects for at least one discrete component. The interconnect substrate is configured to be mounted on at least one die and to have the at least one discrete component mounted on the interconnect substrate.

According to the method and system disclosed herein, the present invention provides a multi-component package having a smaller package that may also have a lower cost.

DETAILED DESCRIPTION OF THE INVENTION

The present invention relates to multi-component packages. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for fabricating an interconnect substrate for a multi-component package. The multi-component package includes at least one die and a package substrate. The method and system include providing an insulating base and providing at least one conductive layer. The at least one conductive layer provides interconnects for at least one discrete component. The interconnect substrate is configured to be mounted on the at least one die and to have the at least one discrete component mounted on the interconnect substrate.

The present invention will be described in terms of particular components and particular dice. However, one of ordinary skill in the art will readily recognize that other and/or additional components and other and/or additional dice could be used. In addition, the present invention is described in the context of particular methods. The present application is also described in the context of a particular package type. One of ordinary skill in the art will, however, readily recognize that other packages could be used. Thus, the present invention is consistent with the used of packages including but not limited to stacked-die packaging, package-in-package and package-on-package devices. One of ordinary skill in the art will readily recognize that for ease of explanation, steps may be omitted or merged in the methods described.

Figure 1:
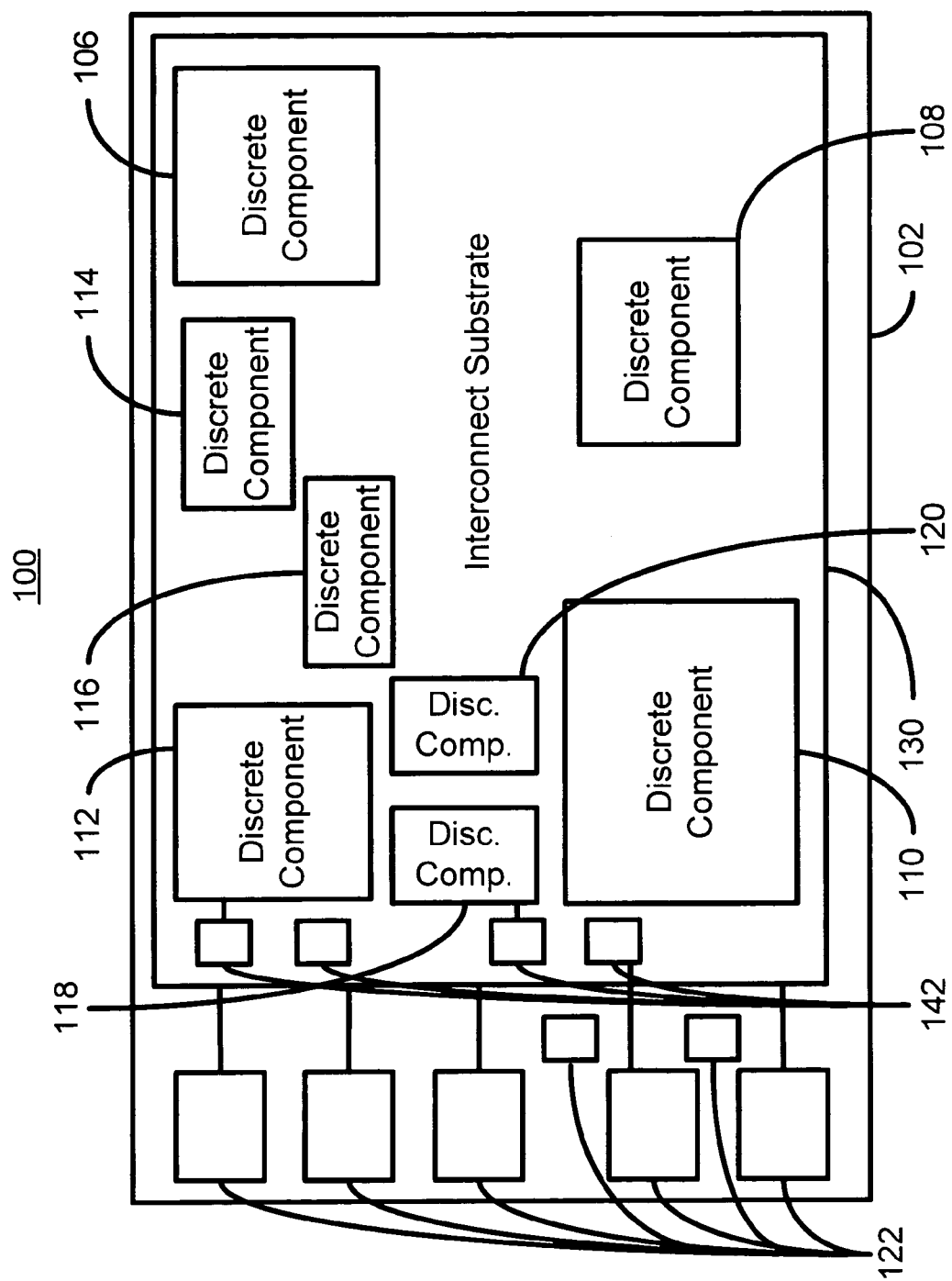
FIG. 1 depicts a top view of one embodiment of a multi-component package including one embodiment of an interconnect substrate in accordance with the present invention.
Figure 2:
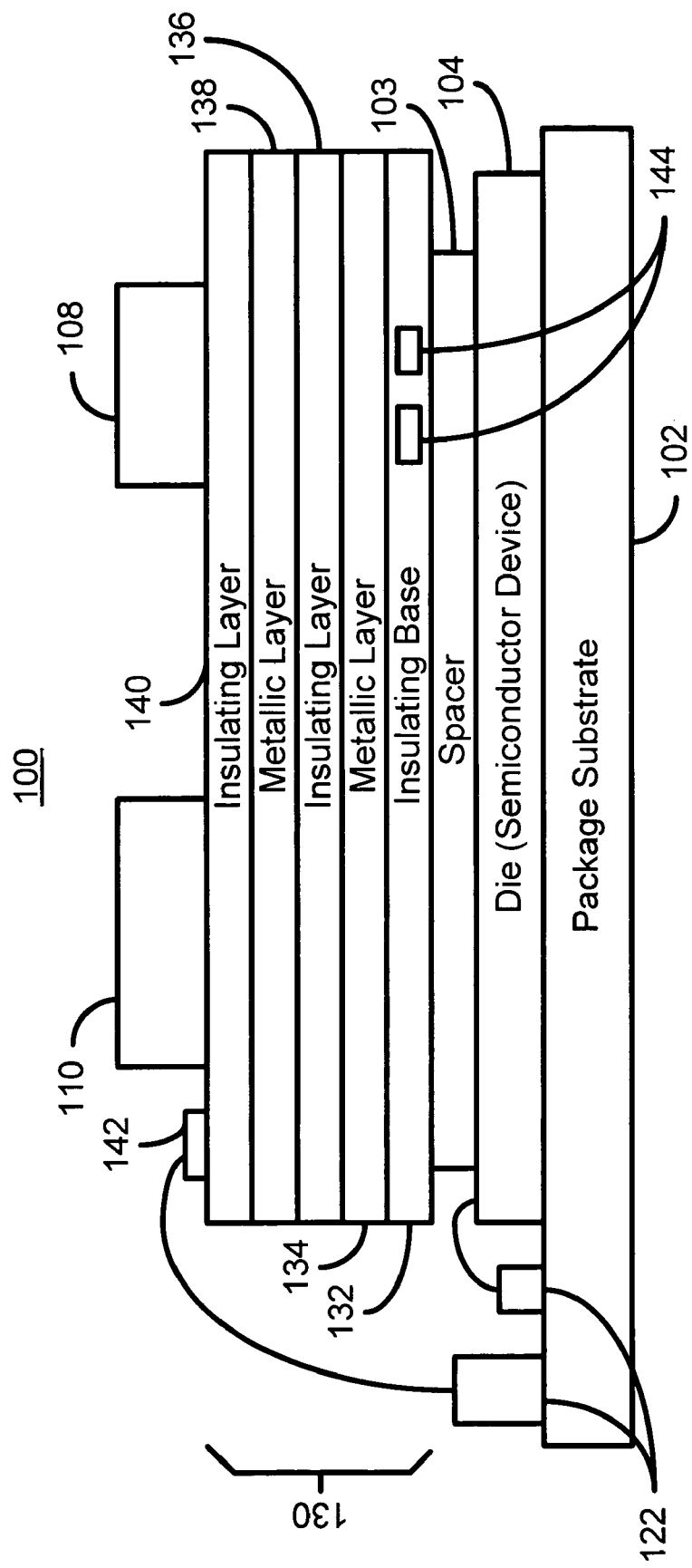
FIG. 2 depicts a side view of one embodiment of a multi-component package including one embodiment of an interconnect substrate in accordance with the present invention.

FIG. 1 depicts a top view of one embodiment of a multi-component package 100 including one embodiment of an interconnect substrate 130 in accordance with the present invention. FIG. 2 depicts a side view of one embodiment of the multi-component package 100 including one embodiment of an interconnect substrate in accordance with the present invention. For clarity, FIGS. 1 and 2 are not drawn to scale. Referring to FIGS. 1 and 2, the multi-component package 100 includes a package substrate 102, at least one die 104 coupled with the package substrate, discrete components 106, 108, 110, 112, 114, 116, 118, and 120, spacer 103, an interconnect substrate 130, and components 122. The discrete components 106, 108, 110, 112, 114, 116, 118, and 120 may be active and/or passive components. Thus, the discrete components 106, 108, 110, 112, 114, 116, 118, and 120 may include filters, crystals, voltage sources, switches, capacitors, resistors, or other components.

The interconnect substrate 130 includes an insulating base 132 and at least one conductive layer. In the embodiment shown, the interconnect substrate 130 includes two conductive layers 134 and 138, two dielectric layers 136 and 140, and pads 142. The base 132 is preferably silicon, but may be made of other materials, such as an epoxy polymer. In one embodiment, the base layer 102 is substantially 130 microns thick.

The conductive layers 134 and 138 are preferably metal layers, for example aluminum, copper, gold, or their alloys. In addition, a metal layer 134 and/or 138 may be configured to facilitate soldering or wirebonding, for example by over-plating, or by thin-film vacuum metal deposition processes like evaporation and sputtering the metal layer 134 and/or 136 with nickel and gold. The conductive layers 134 and 138 are separated and covered by dielectric layers 136 and 140, which may be silicon dioxide, silicon nitride, or another material, such as polyamide, Benzocyclobutene (BCB). The metal layers 134 and 138 may be formed using plating or other vacuum metal deposition processes. The metal layers 134 and 138 form interconnection circuitry for the discrete components 106, 108, 110, 112, 114, 116, 118, and 120. For example, the metal layers 134 and 138 may include a ground plane and/or an EMF shielding plane in addition to metallic interconnects. Note that layers 134, 136, 138, and 140 are depicted in FIG. 2 as solid layers. However, portions of the layers 134, 136, 138, and 140 may penetrate each other and generally are not solid. Consequently, the layers 134, 136, 138, and 140 form interconnects routed to the appropriate portions of the semiconductor package 100.

The pads 142 may be used for electrically coupling with the discrete components 106, 108, 110, 112, 114, 116, 118, and 120. The pads 142 may be used to electrically couple to the die 104, and/or to the package substrate 102. The pads 142 may be wirebond pads, land patterns, and/or other types of pads. In addition, the interconnect substrate 130 may also include passive components 144, such as resistors and capacitors. In a preferred embodiment, the passive components 144 are fabricated in the insulating base 132.

The interconnect substrate 130 is preferably mounted on the die 104. Therefore, in some embodiments, the spacer 103, preferably made of silicon, may be utilized for standoff. The discrete components 106, 108, 110, 112, 114, 116, 118, and 120 are mounted on the interconnect substrate 130. Note that the multi-component package 100 may include other discrete components 122 mounted on another portion of the multi-component package 100, such as the package substrate 102.

Because the interconnect substrate 130 is utilized, additional interconnects and discrete components 106, 108, 110, 112, 114, 116, 118, and 120 may be utilized without requiring the package substrate 102 to directly support the interconnects and discrete components 106, 108, 110, 112, 114, 116, 118, and 120. Stated differently, a significant amount of interconnection circuitry required for the discrete components 106, 108, 110, 112, 114, 116, 118, and 120 may be included in the interconnect substrate 130 rather than in the package substrate. Furthermore, the package substrate 102 need not be large enough to separately mount the components 106, 108, 110, 112, 114, 116, 118, and 120. Consequently, the footprint of the package substrate 102 may be smaller. The overall cost of the multi-component package 100 may also be reduced. Consequently, a smaller, less expensive multi-component package having higher interconnectivity may be provided.

Figure 3:
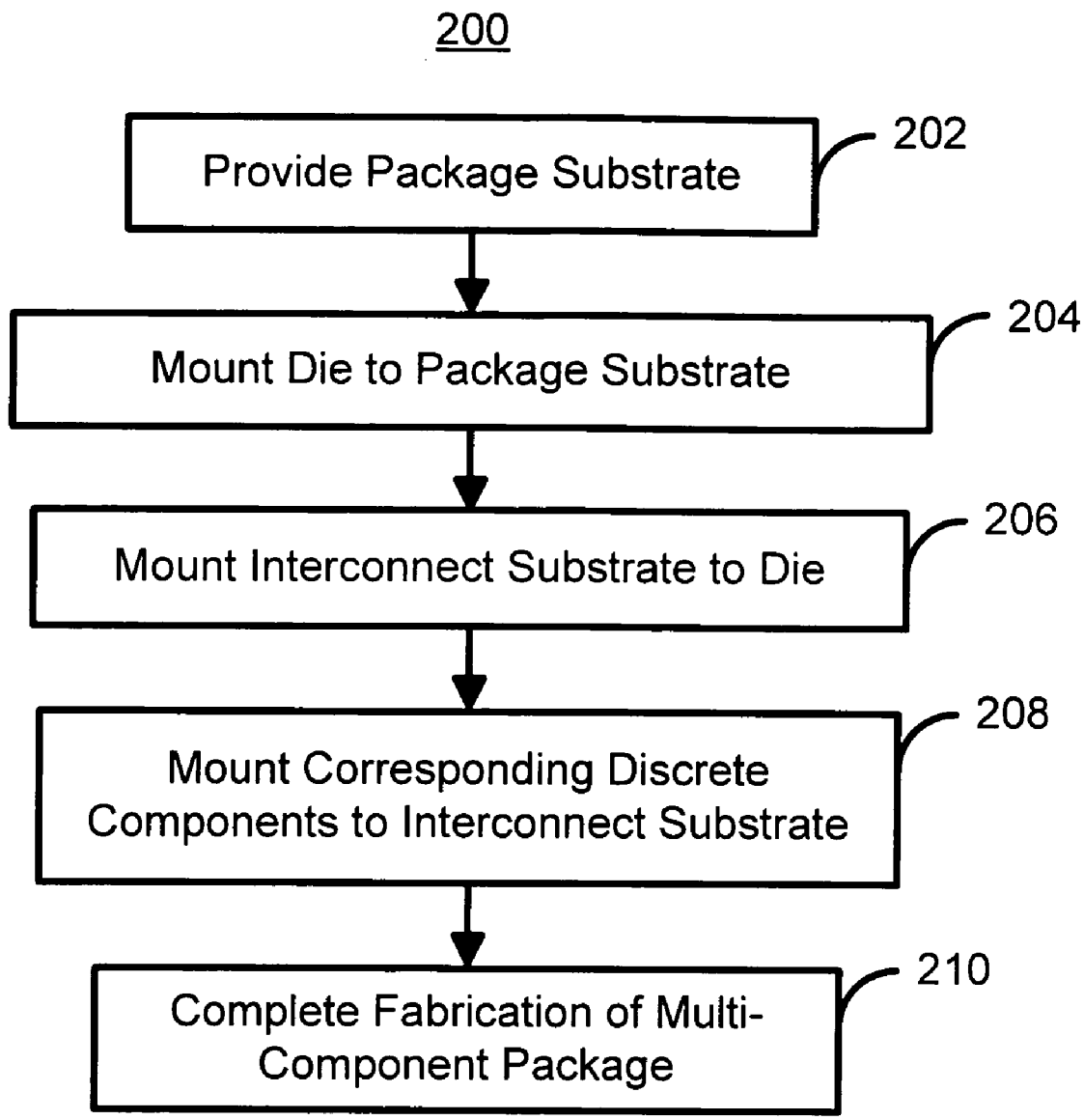
FIG. 3 is a flow chart depicting one embodiment of a method for providing a multi-component package in accordance with the present invention.

FIG. 3 is a flow chart depicting one embodiment of a method 200 for providing a multi-component package 100 in accordance with the present invention. The package substrate 102 is provided, via step 202. The die 104 is mounted on the package substrate 102, via step 204. Mounting the die 104 may include electrically coupling the die 104 to the package substrate 102. The interconnect substrate 130 is mounted on the die 102, via step 206. Step 206 may include mounting the spacer 103 on the die and mounting the interconnect substrate 130 on the spacer 103. If the physical size of the interconnect substrate 130 is smaller than the die 104 and can be placed on die 104 without encroaching on the die 104 bond pads, then spacer 103 may be omitted. Step 206 may also include electrically coupling the interconnect substrate 130 to the die 104 and/or package substrate 102. The discrete components 106, 108, 110, 112, 114, 116, 118, and 120 are mounted on the interconnect substrate 130, via step 208. Step 208 preferably includes affixing and the discrete components 106, 108, 110, 112, 114, 116, 118, and 120 to the interconnect substrate 130 and electrically connecting the discrete components 106, 108, 110, 112, 114, 116, 118, and 120 to portions of the multi-component device, such as the interconnect substrate. Fabrication of the multi-component package 100 may be completed, via step 210. Note that if at least one of the die 102, interconnect substrate 130, and discrete components 106, 108, 110, 112, 114, 116, 118, and 120 were not electrically connected in steps 204, 206, and 208, these component(s) 102, 106, 108, 110, 112, 114, 116, 118, 120, and/or 130 may be electrically coupled in step 210. In addition, other components 122 may be mounted and electrically coupled.

Using the method 200, the multi-component package 100 may be fabricated. Consequently, a smaller, less expensive multi-component package having higher interconnectivity may be provided.

A method and system for providing a multi-component device having increased connectivity and decreased size are described. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. An interconnect substrate for a multi-component package, the multi-component package including at least one die coupled to a package substrate, the interconnect substrate comprising:
   a unitary insulating base;
   at least one conductive layer for providing interconnects for at least one discrete component;
   at least one passive component electrically coupled to the at least one conductive layer, wherein the passive component is positioned within the unitary insulating base and the passive component and the conductive layer are electrically coupled within the substrate;
   wherein the interconnect substrate abuts a silicon spacer that is interposed between the at least one die and the interconnect substrate, wherein the silicon spacer also abuts the at least one die, the interconnect substrate having at least one discrete component mounted on the interconnect substrate.

2. The interconnect substrate of claim 1 wherein the insulating base is silicon.

3. The interconnect substrate of claim 1 wherein the insulating base is a polymer.

4. The interconnect substrate of claim 1 further comprising:
   at least one pad for allowing for connectivity to the at least one conductive layer.

5. The interconnect substrate of claim 4 wherein the at least one pad further includes at least one wirebond pad.

6. The interconnect substrate of claim 4 wherein the at least one pad provides connectivity to at least one of the at least one discrete component, the at least one die and the package substrate.

7. The interconnect substrate of claim 1 wherein the interconnect substrate has a thickness of substantially 130 microns.

8. The interconnect substrate of claim 1 wherein the at least one conductive layer includes a plurality of conductive layers and wherein the interconnect substrate further includes at least one insulating layer separating each of the plurality of conductive layers.

9. The interconnect substrate of claim 1 wherein the at least one conductive layer is at least one metallic layer.

10. The interconnect substrate of claim 1, wherein the at least one passive component comprises at least one of a resistor and a capacitor.

11. The interconnect substrate of claim 1, wherein the at least one passive component is incorporated in the insulating layer.

12. A multi-component package comprising:
a package substrate;
at least one die coupled with the package substrate;
at least one discrete component; and
an interconnect substrate including a unitary insulating base and at least one conductive layer abutting the unitary insulating base for providing interconnects for the at least one discrete component, at least one passive component being positioned within the unitary insulating base and electrically coupled to the at least one conductive layer, wherein the passive component and the conductive layer are electrically coupled within the interconnect substrate,
the interconnect substrate abutting a silicon spacer that is interposed between the at least one die and the interconnect substrate, wherein the silicon spacer also abuts the at least one die, and the at least one discrete component is mounted on the interconnect substrate.

13. The multi-component package of claim 12 wherein the insulating base is silicon.

14. The multi-component package of claim 12 wherein the insulating base is a polymer.

15. The multi-component package of claim 12 wherein the interconnect substrate further includes:
at least one pad for allowing for connectivity to the at least one conductive layer.

16. The multi-component package of claim 15 wherein the at least one pad further includes at least one wirebond pad.

17. The multi-component package of claim 15 wherein the at least one pad provides connectivity to at least one of the at least one discrete component, the at least one die and the package substrate.

18. The multi-component package of claim 12 wherein the interconnect substrate has a thickness of substantially 130 microns.

19. The multi-component package of claim 12 wherein the at least one conductive layer includes a plurality of conductive layers and wherein the interconnect substrate further includes at least one insulating layer separating each of the plurality of conductive layers.

20. The multi-component package of claim 12 wherein the at least one conductive layer is at least one metallic layer.

21. The multi-component package of claim 12 wherein the at least one discrete component includes at least one of at least one passive component and at least one active component.

22. The multi-component package of claim 12 wherein the interconnect is mounted on the die.

23. The multi-component package of claim 12, wherein the at least one passive component comprises at least one of a resistor and a capacitor.

24. The multi-component package of claim 12, wherein the at least one passive component is incorporated in the insulating layer.

25. A method for providing multi-component package comprising:
providing a package substrate;
mounting at least one die on the package substrate;
positioning a silicon spacer on the at least one die;
mounting an interconnect substrate on the silicon spacer, the interconnect substrate and the at least one die abutting the silicon spacer, the interconnect substrate including a unitary insulating base, and at least one conductive layer abutting the unitary insulating base for providing interconnects for at least one discrete component, and at least one passive component positioned within the unitary insulating base and electrically coupled to the at least one conductive layer, the passive component and the conductive layer being electrically coupled within the substrate; and
mounting the at least one discrete component on the interconnect substrate.

26. The method of claim 25 wherein the insulating base is silicon.

27. The method of claim 25 wherein the insulating base is a polymer.

28. The method of claim 27 wherein the at least one pad further includes at least one wirebond pad.

29. The method of claim 27 wherein the at least one pad provides connectivity to at least one of the at least one discrete component, the at least one die and the package substrate.

30. The method of claim 25 wherein the interconnect substrate includes at least one pad for allowing for connectivity to the at least one conductive layer.

31. The method of claim 25 wherein the interconnect substrate has a thickness of substantially 130 microns.

32. The method of claim 25 wherein the at least one conductive layer includes a plurality of conductive layers and wherein the interconnect substrate further includes at least one insulating layer separating each of the plurality of conductive layers.

33. The method of claim 25 wherein the at least one conductive layer is at least one metallic layer.

34. The method of claim 25 wherein mounting the at least one discrete component includes mounting at least one of at least one passive component and at least one active component.

35. The method of claim 25, wherein mounting on the at least one die an interconnect substrate comprises coupling at least one of a resistor and a capacitor to the at least one conductive layer.

36. The method of claim 25, wherein mounting on the at least one die an interconnect substrate comprises incorporating the at least one passive component into the insulating layer.

* * * * *

UNITED STATES PATENT AND TRADEMARK OFFICE
CERTIFICATE OF CORRECTION

| | | |
|---|---|---|
| PATENT NO. | : 7,821,122 B2 | Page 1 of 1 |
| APPLICATION NO. | : 11/315409 | |
| DATED | : October 26, 2010 | |
| INVENTOR(S) | : Ken M. Lam | |

It is certified that error appears in the above-identified patent and that said Letters Patent is hereby corrected as shown below:

In column 5, line 23, in Claim 12, delete "with" and insert -- to --, therefor.

In column 5, line 28, in Claim 12, before "at" insert -- the --.

Signed and Sealed this
Twenty-ninth Day of March, 2011

David J. Kappos
*Director of the United States Patent and Trademark Office*